US012628661B2

(12) United States Patent
Yu et al.

(10) Patent No.: US 12,628,661 B2
(45) Date of Patent: May 12, 2026

(54) CHIP PACKAGE HAVING DIE PAD WITH PROTECTIVE LAYER

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 378 days.

(21) Appl. No.: 18/242,510

(22) Filed: Sep. 5, 2023

(65) Prior Publication Data

US 2024/0096758 A1     Mar. 21, 2024

(30) Foreign Application Priority Data

Sep. 19, 2022     (TW) .................................. 111135356

(51) Int. Cl.
*H10W 70/40*          (2026.01)
*H10W 74/00*          (2026.01)
*H10W 90/00*          (2026.01)

(52) U.S. Cl.
CPC ........ *H10W 70/411* (2026.01); *H10W 70/424* (2026.01); *H10W 70/465* (2026.01); *H10W 74/00* (2026.01); *H10W 90/754* (2026.01)

(58) Field of Classification Search
CPC ......... H01L 24/02; H01L 24/45; H01L 24/49; H01L 24/85; H01L 24/48; H01L 23/49503; H10W 70/411; H10W 70/424; H10W 70/465; H10W 74/00; H10W 90/754; H10W 72/075; H10W 72/50; H10W 72/90
See application file for complete search history.

(56) References Cited

U.S. PATENT DOCUMENTS

2008/0272487 A1* 11/2008 Shim ................... H10W 72/075
                                                    257/737
2010/0181567 A1*  7/2010 Mun ........................ H01L 24/05
                                                    257/E23.012
2021/0305139 A1*  9/2021 Chien ................. H10W 70/411

* cited by examiner

*Primary Examiner* — Steven B Gauthier
*Assistant Examiner* — Marc-Anthony Armand
(74) *Attorney, Agent, or Firm* — Fei-hung Yang

(57)          ABSTRACT
A chip package having die pads with protective layers is provided. At least one protective layer is covering and arranged at a peripheral zone of at least one die pad for minimizing area of the die pad exposed outside as well as shielding and protecting the peripheral zone of the die pad. A weld zone of the die pad is not covered by the protective layer so that the weld zone of the die pad is exposed. In a crossed-over state, one of bonding wires crossing one of the die pads with a corresponding connection pad of a carrier plate will not get across a second upper space defined by the weld zone of the rest of the die pads. Thereby the one of the bonding wires can be more isolated by the protective layers on the peripheral zones of the rest of the die pads.

2 Claims, 10 Drawing Sheets

10

CHIP PACKAGE HAVING DIE PAD WITH PROTECTIVE LAYER

CROSS-REFERENCE TO RELATED APPLICATIONS

This non-provisional application claims priority under 35 U.S.C. § 119(a) on Patent Application No(s). 111135356 filed in Taiwan, R.O.C. on Sep. 19, 2022, the entire contents of which are hereby incorporated by reference.

BACKGROUND OF THE INVENTION

This is chip package, especially to a chip package having die pads with protective layers.

In the semiconductor field, a conventional chip package is electrically connected with a carrier plate by a bonding wire generated during wire bonding. Refer to FIG. 11 and FIG. 12, during wire bonding between a chip package 4 and a carrier plate 2, a plurality of die pads 4a on the chip package 4 are electrically connected with a plurality of corresponding connection pads 2a on the carrier plate 2 by a plurality of bonding wires 3 generated during wire bonding. The respective bonding wires 3 go across from the die pads 4a to the corresponding connection pads 2a to be in a crossed-over state. However, while in the crossed-over state, the bonding wire 3 may cross over a space on top of the other die pads 4a so that signals travelling through the bonding wire 3 and the die pads 4a interfere with each other. The operation of an electronic system may be disturbed and even ruined. Moreover, in order to avoid signal interference between the bonding wire 3 and the respective die pads 4a, manufacturers need to re-arrange positions of the connection pads 2a on the carrier plate 2 or related circuit. Thereby manufacturing cost is increased.

SUMMARY OF THE INVENTION

Therefore, it is a primary object of the present invention to provide a chip package having die pads with protective layers in which at least one protective layer is covering a peripheral zone of at least one die pad for minimizing area of the respective die pads exposed outside as well as shielding and protecting the peripheral zone of the respective die pads. A weld zone of the respective die pads is not covered by the protective layer so that the weld zone of the respective die pads is exposed. In a crossed-over state, one of bonding wires connecting one of the die pads with a corresponding connection pad of a carrier plate will not get across a second upper space defined by the weld zone of the rest of the die pads. Thereby the bonding wire can be more isolated by the respective protective layers on the peripheral zones of other die pads than ever. The problem of signals through the die pad and the bonding wire interfering with each other can be solved.

In order to achieve the above object, a chip package having die pads with protective layers according to the present invention includes a chip unit, a plurality of die pads, and at least one protective layer. The chip unit has one surface on which the respective die pads are disposed. A weld zone and a peripheral zone surrounding the weld zone are defined on each of the die pads. The weld zone of the die pad is for allowing welding of one end of at least one bonding wire generated during wire bonding. A space located over the die pad is defined as a first upper space while a space located over the weld zone of the die pad is defined as a second upper space which is smaller than the first upper space.

The protective layer is covering and arranged at the peripheral zone of the die pad for minimizing area of the respective die pads exposed outside as well as shielding and protecting the peripheral zone of the respective die pads. The weld zone of the respective die pads is not covered by the protective layer so that the weld zone of the respective die pads is exposed. The chip package is located at a carrier plate which is provided with a plurality of connection pads for allowing welding of one end of the bonding wire generated during wire bonding of the carrier plate. The connection pads and the corresponding die pads of the chip package are in a one-to-one corresponding relationship. The weld zone of the respective die pads on the chip package and the corresponding connection pads on the carrier plate are electrically connected by the respective bonding wires generated during the wire bonding. The bonding wire goes across from the weld zone of the respective die pads to the corresponding connection pad to be in a crossed-over state. Thereby the chip package and the carrier plate are electrically connected. Under the crossed-over state, one of the bonding wires connecting one of the die pads with the corresponding connection pad will not cross the second upper space defined by the weld zone of the rest of the die pads. Thereby the bonding wire can be more isolated by the protective layer on the peripheral zone of other die pads than ever.

Preferably, the protective layers on the chip package are further covering the peripheral zones of a part of the die pads of the chip package.

Preferably, the respective protective layers on the chip package are further covering the peripheral zones of all of the die pads of the chip package, and also covering the surface of the chip unit completely.

Preferably, the protective layer on the chip package is covering the peripheral zone of only one of the die pads of the chip package.

DETAILED DESCRIPTION OF THE PREFERRED EMBODIMENT

Figure 1:
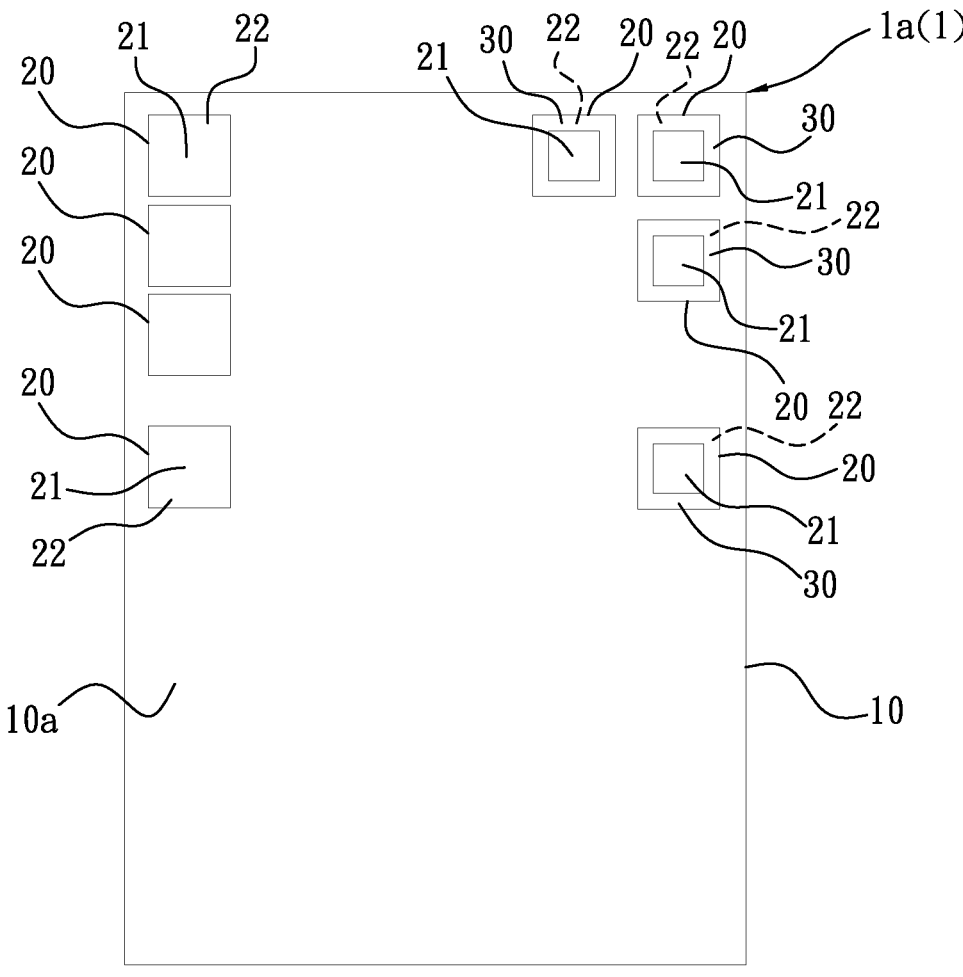
FIG. 1 is a schematic drawing showing a top view of an embodiment according to the present invention.
Figure 2:
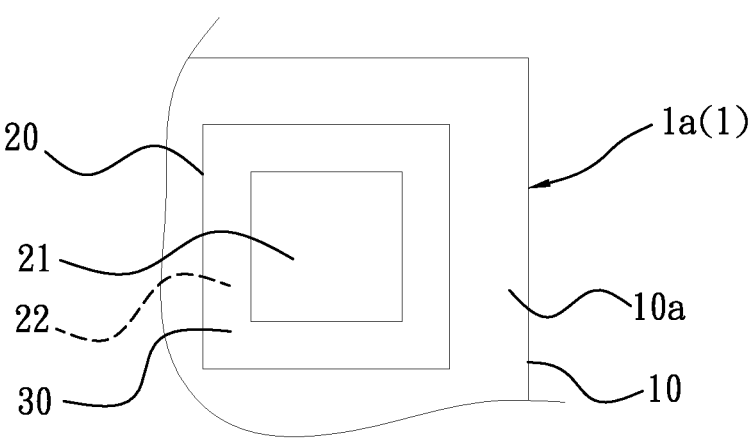
FIG. 2 is a partial enlarged view of the embodiment in FIG. 1 according to the present invention.
Figure 3:
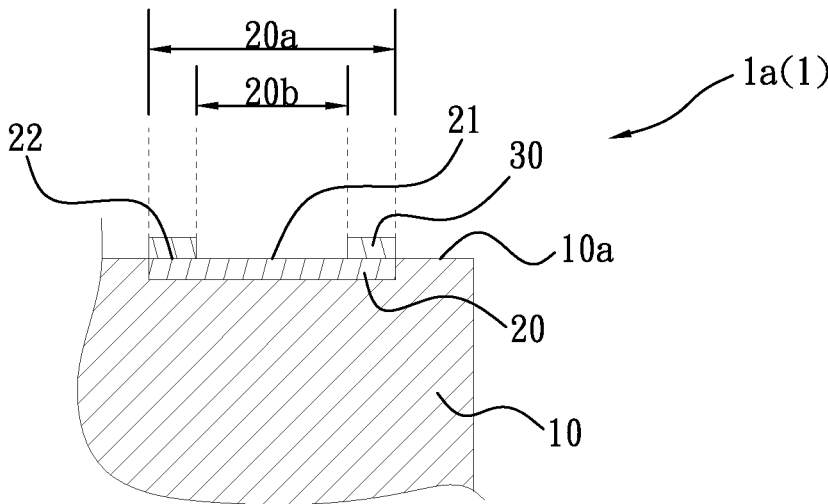
FIG. 3 is a side view of a section of the embodiment in FIG. 2 according to the present invention.
Figure 4:
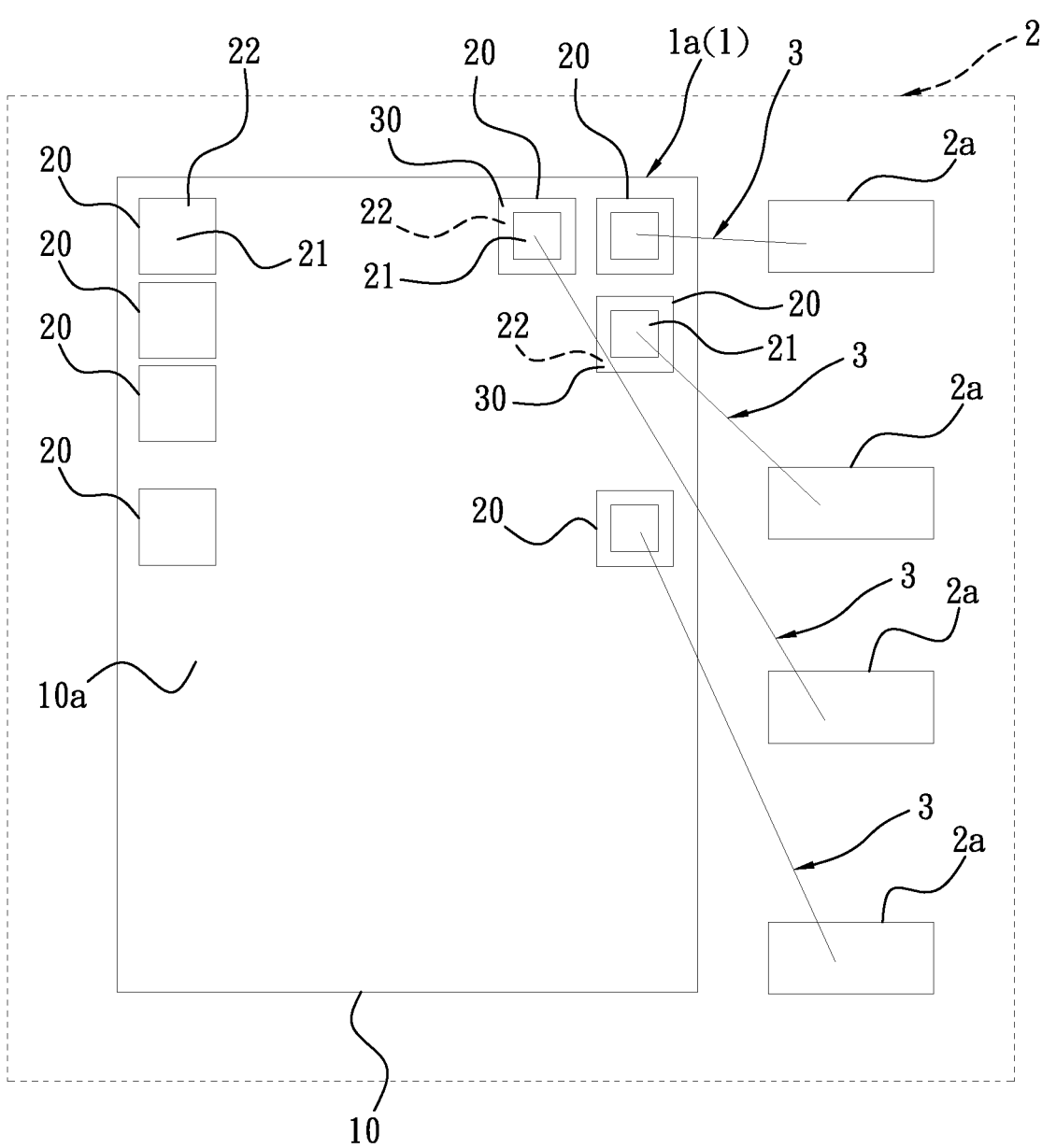
FIG. 4 is a schematic drawing showing a top view of an embodiment applied to a carrier plate according to the present invention.
Figure 5:
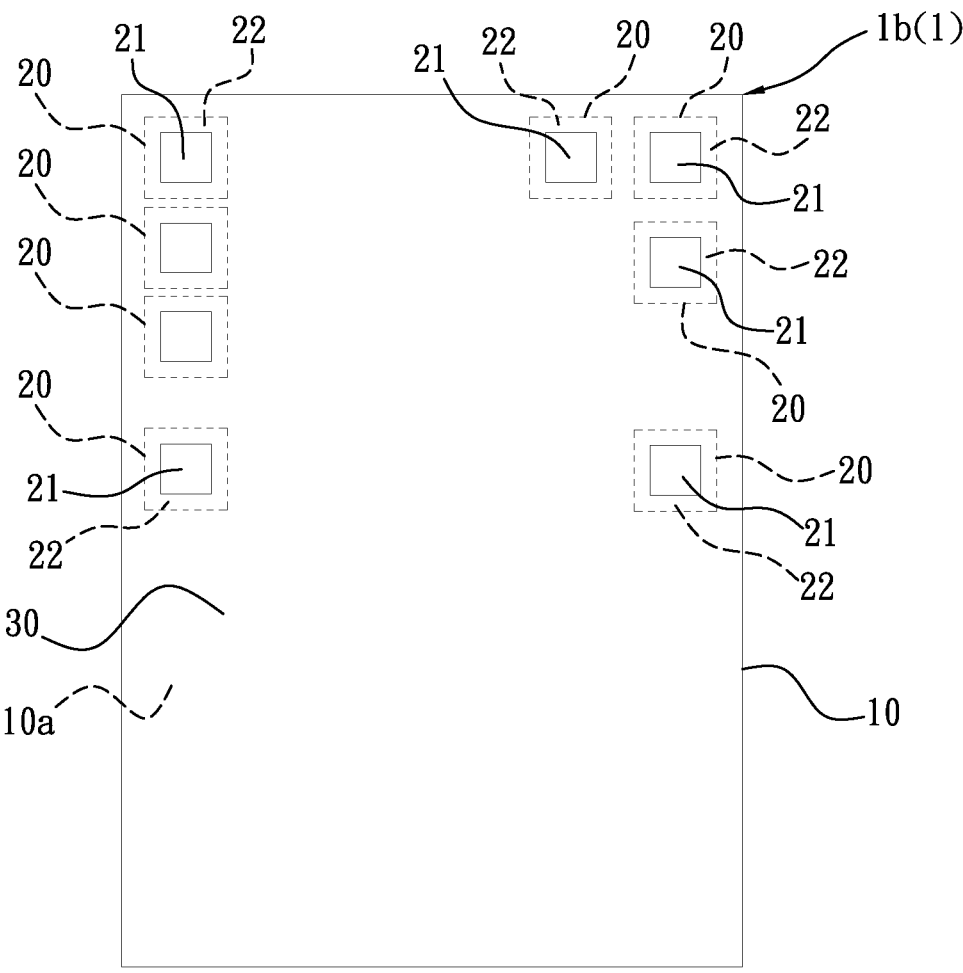
FIG. 5 is a schematic drawing showing a top view of another embodiment according to the present invention.
Figure 9:
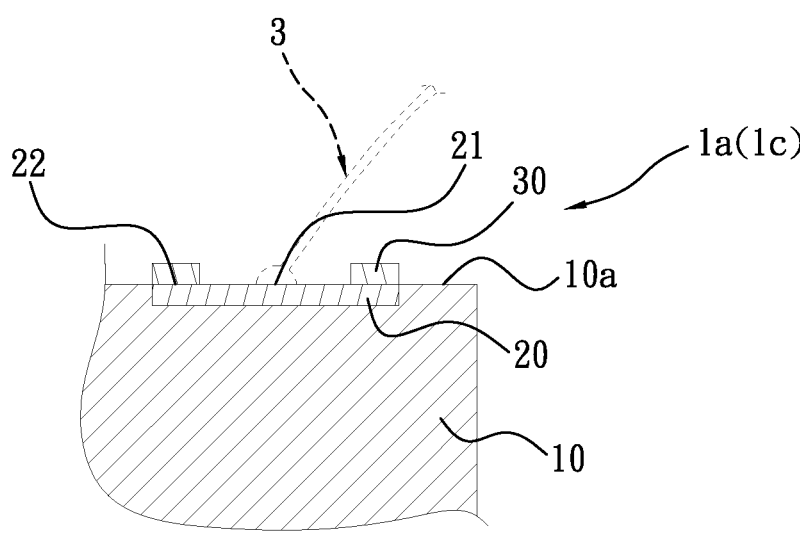
FIG. 9 is a partial enlarged side view showing a die pad during wire bonding of an embodiment according to the present invention.
Figure 10:
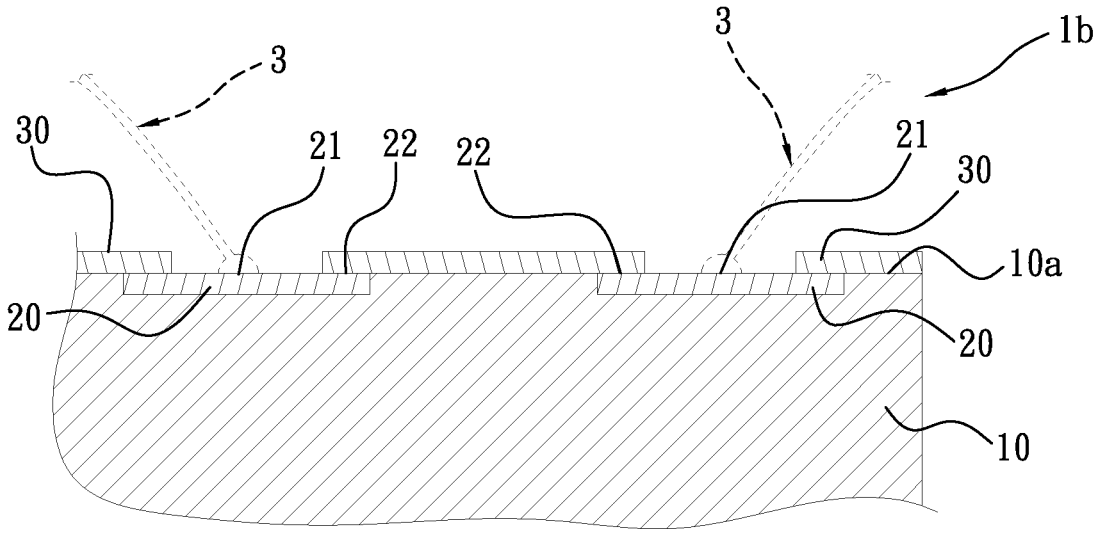
FIG. 10 is a partial enlarged side view showing a plurality of die pads during wire bonding of an embodiment according to the present invention.
Figure 11:
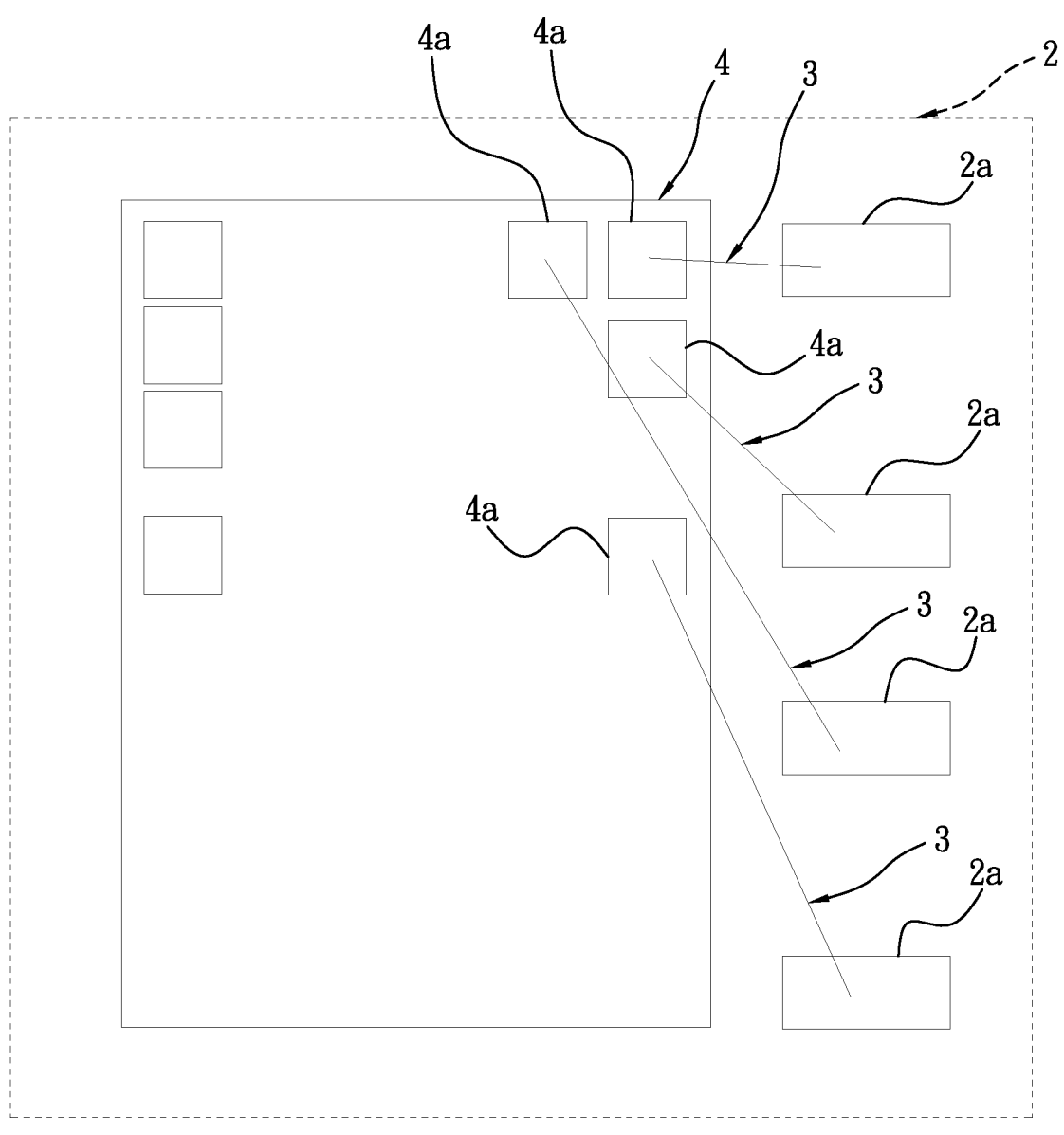
FIG. 11 is a schematic drawing showing a top view of a prior art.
Figure 12:
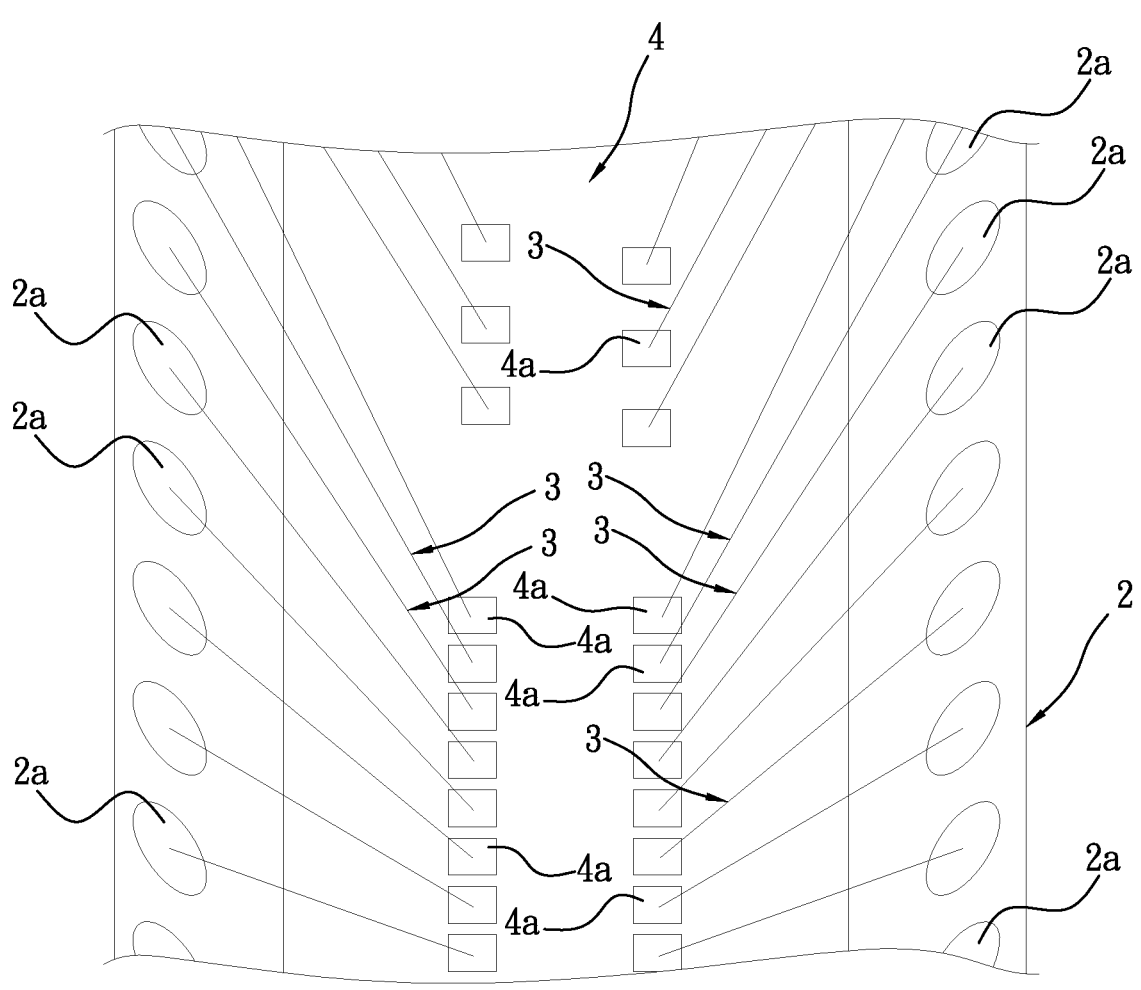
FIG. 12 is a schematic drawing showing a top view of another prior art.

Refer to FIG. 1, FIG. 2, and FIG. 3, a chip package 1 having die pads with protective layers is provided. The chip package 1 includes a chip unit 10, a plurality of die pads 2, and at least one protective layer 30. The chip unit 10 has one surface 10a on which the respective die pads 20 are disposed. A weld zone 21 and a peripheral zone 22 surrounding the weld zone 21 are defined on each of the die pads 20. The weld zone 21 of the die pad 20 is for allowing welding of one end of at least one bonding wire 3 generated during wire bonding of the chip package 1, as shown in FIG. 4, FIG. 9, and FIG. 10. Refer to FIG. 3, a space located over the respective die pads 20 is defined as a first upper space 20a. Similarly, a space located over the weld zone 21 of the respective die pads 20 is defined as a second upper space 20b which is smaller than the first upper space 20a, as shown in FIG. 3. The respective die pads 20 are made of aluminum, but not limited.

The protective layer 30 is covering and arranged at the peripheral zone 22 of the die pad 20 for minimizing area of the respective die pads 20 exposed outside as well as shielding and protecting the peripheral zone 22 of the respective die pads 20, as shown in FIG. 1 and FIG. 2. The weld zone 21 of the respective die pads 20 is not covered by the protective layer 30 so that the weld zone 21 of the respective die pads 20 is exposed, as show in FIG. 1-3.

Figure 6:
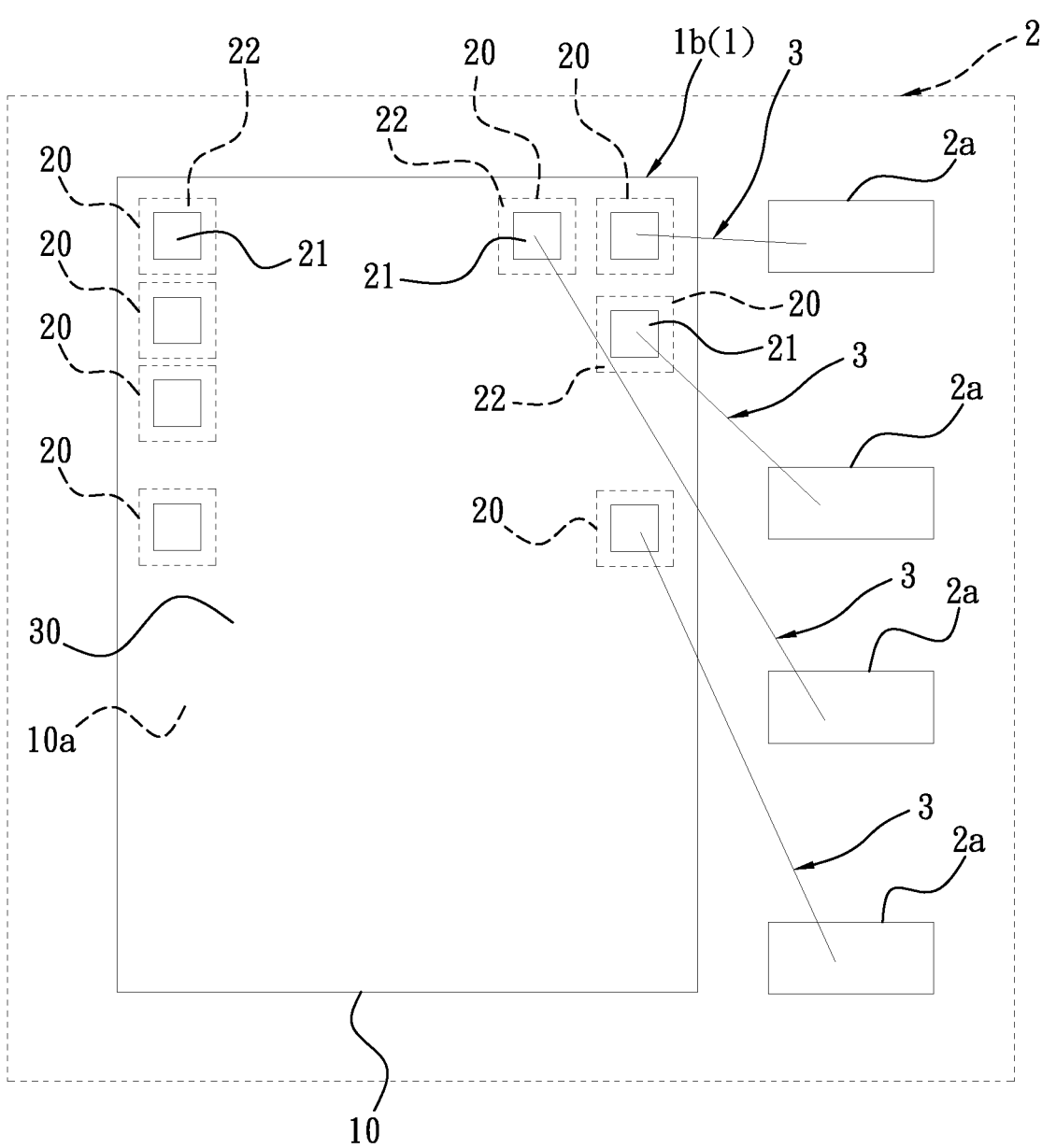
FIG. 6 is a schematic drawing showing a top view of another embodiment applied to a carrier plate according to the present invention.
Figure 7:
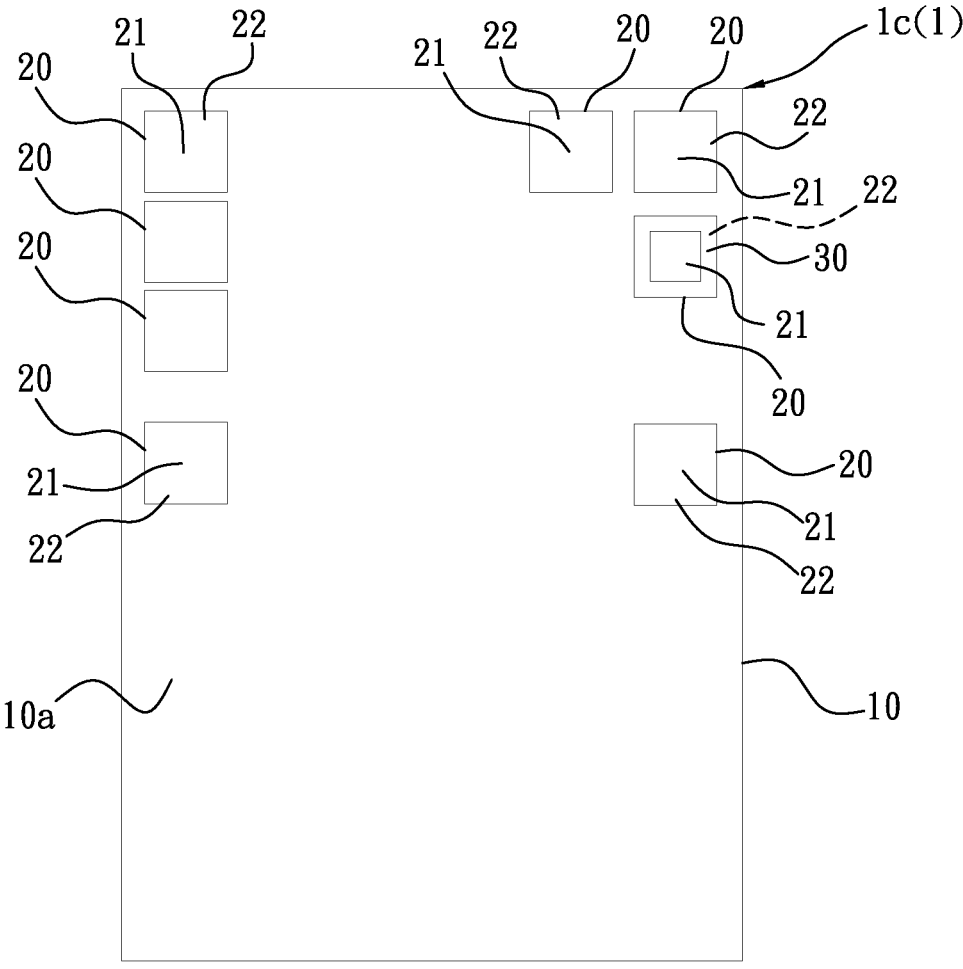
FIG. 7 is a schematic drawing showing a top view of a further embodiment according to the present invention.
Figure 8:
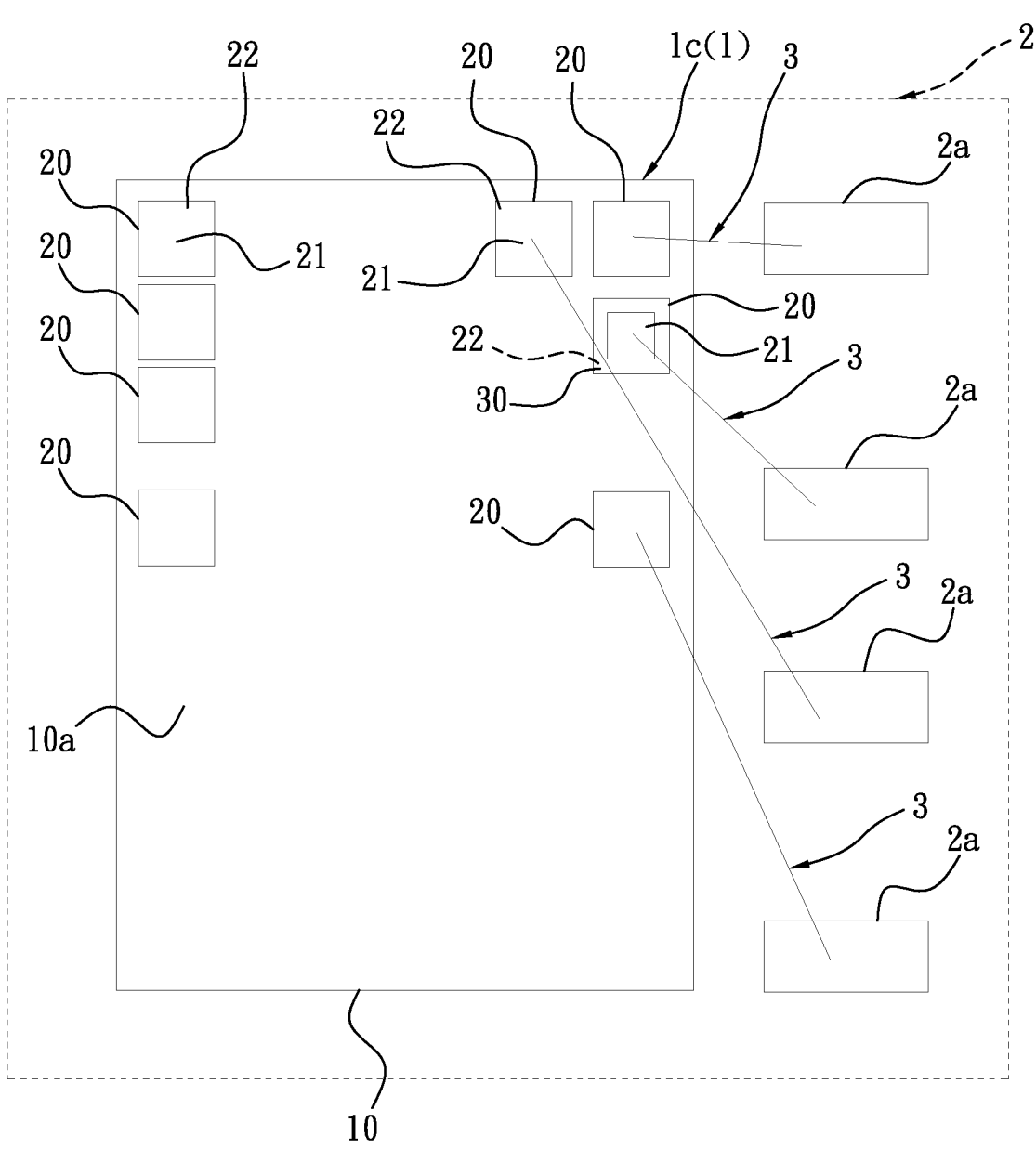
FIG. 8 is a schematic drawing showing a top view of a further embodiment applied to a carrier plate according to the present invention.

Refer to FIG. 4, FIG. 6, and FIG. 8, the chip package 1 is located at a carrier plate 2 which is provided with a plurality of connection pads 2a for allowing welding of one end of the bonding wire 3 generated during wire bonding of the carrier plate 2. The connection pads 2a and the corresponding die pads 20 of the chip package 1 are in a one-to-one corresponding relationship, as shown in FIG. 4, FIG. 6, and FIG. 8.

While performing wire bonding on the chip package 1 and the carrier plate 2, the weld zone 21 of the respective die pads 20 on the chip package 1 and the respective connection pads 2a on the carrier plate 2 are electrically connected by the respective bonding wires 3 generated during the wire bonding. The bonding wire 3 goes across from the weld zone 21 of the respective die pads 20 to the corresponding connection pad 2a to be in a crossed-over state, as shown in FIG. 4, FIG. 6, and FIG. 8. Thereby the chip package 1 and the carrier plate 2 are electrically connected.

In the crossed-over state, one of the bonding wires 3 connecting one of the die pads 20 with the corresponding connection pad 2a will not pass through the second upper space 2b (as shown in FIG. 3) defined by the weld zone 21 of the rest of the die pads 20, as shown in FIG. 4, FIG. 6, and FIG. 8. Thereby the bonding wire 3 going across from the die pad 20 to the corresponding connection pad 2a can be more isolated than ever by the respective protective layers 30 on the peripheral zones 22 of the other die pads 20, as shown in FIG. 4, FIG. 6, and FIG. 8-10.

According to different arrangement patterns of the respective protective layers 30 covering the chip package 1, the chip package 1 includes three embodiments, the first embodiment (the chip package 1a), the second embodiment (the chip package 1b), and the third embodiment (the chip package 1c), but not limited.

As shown in the first embodiment of FIG. 4 and FIG. 9, the respective protective layers 30 on the chip package 1a are covering the peripheral zone 22 of a part of the respective die pads 20. In the second embodiment shown in FIG. 6 and FIG. 10, the respective protective layers 30 on the chip package 1b are further covering the peripheral zone 22 of all of the respective die pads 20. The protective layers 30 are also covering the surface 10a of the chip unit 10 completely, but not limited. As to the third embodiment, as shown in FIG. 8 and FIG. 9, the protective layer 30 on the chip package 1c is covering the peripheral zone of only one of the die pads 20. Thereby there is no need to arrange the protective layer 30 in a large amount or over a large area and this helps to save manufacturing cost.

The chip package 1 according to the present invention has the following advantages.

(1) The problem of signals travelling through the die pad 20 and the bonding wire 3 that interfere with each other can be solved. That means an issue of electronic systems operated by semiconductor chip products (such as the chip package 1) are unable to run normally due to signal interference can be addressed. While being applied to fields of medicine or transportation, the electronic systems operated by semiconductor chip products (such as the chip package 1) can work well and further protect user's safety. The semiconductor chip products are more competitive in the market.

(2) For manufacturers, there is no need to re-design the respective connection pads 2a and related circuit on the carrier plate 2 or to design a new carrier plate to avoid the interference between the die pad 20 and the bonding wire 3. The original carrier plate 2 can be used directly. This helps to reduce the cost of production.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A chip package having die pads with protective layers comprising:

a chip unit provided with a surface;

a plurality of the die pads disposed on the surface of the chip unit while a weld zone and a peripheral zone surrounding the weld zone are defined on each of the die pads; wherein the weld zone of the die pad is for allowing welding of one end of at least one bonding wire generated during wire bonding of the chip package; wherein a space located over the die pad is defined as a first upper space while a space located over the weld zone of the die pad is defined as a second upper space which is smaller than the first upper space; and the at least one protective layer which is covering and arranged at the peripheral zone of at least one of the die pads for minimizing area of the die pad exposed outside as well as shielding and protecting the peripheral zone of the die pad; wherein the weld zone of the die pad is not covered by the protective layer so that the weld zone of the die pad is exposed; wherein the protective layer on the chip package is further covering the peripheral zone of a part of the die pads of the chip package;

wherein the chip package is located at a carrier plate which is provided with a plurality of connection pads for allowing welding of one end of the bonding wire generated during wire bonding of the carrier plate; the connection pad and the corresponding die pad of the chip package are in a one-to-one corresponding relationship;

wherein while performing wire bonding on the chip package and the carrier plate, the weld zone of the die pad on the chip package and the corresponding connection pad on the carrier plate are electrically connected by the bonding wire generated during the wire bonding; thereby the bonding wire goes across from the weld zone of the die pad to the corresponding connection pad to be in a crossed-over state while the chip package and the carrier plate are electrically connected;

wherein under the crossed-over state, one of the bonding wires connecting one of the die pads with the corresponding connection pad will not cross the second upper space defined by the weld zone of the rest of the die pads; thereby the one of the bonding wires is more isolated by the protective layer on the peripheral zone of the rest of the die pads.

2. The chip package as claimed in claim 1, wherein the die pad is made of aluminum materials.

* * * * *